United States Patent [19]

Steitz et al.

[11] Patent Number: 5,127,570
[45] Date of Patent: Jul. 7, 1992

[54] FLEXIBLE AUTOMATED BONDING METHOD AND APPARATUS

[75] Inventors: Richard R. Steitz; Melvin C. August, both of Chippewa Falls; Diane M. Christie, Eau Claire, all of Wis.; Deanna M. Dowdle, Northfield; Dean B. Dudley, Prior Lake, both of Minn.; Stephen E. Nelson, Chippewa Falls, Wis.; Eugene F. Neumann, Chippewa Falls, Wis.; Paul E. Schroeder, Chippewa Falls, Wis.

[73] Assignee: Cray Research, Inc., Eagan, Minn.

[21] Appl. No.: 545,271

[22] Filed: Jun. 28, 1990

[51] Int. Cl.5 .................... B23K 101/42; B23K 31/02
[52] U.S. Cl. .................... 228/103; 228/180.1; 228/180.2; 29/834; 156/643; 174/254; 174/263; 174/266
[58] Field of Search .................... 228/180.2, 103, 106, 228/62, 5.5, 180.1; 29/834, 846; 156/643, 902; 174/254, 263, 266

[56] References Cited

U.S. PATENT DOCUMENTS 3,670,409  6/1972  Reimer .
4,285,002  8/1981  Campbell .
4,383,270  5/1983  Schelhorn .
4,417,392 11/1983  Ibrahim et al. .
4,780,177 10/1988  Wojnarowski et al. .
4,812,421  3/1989  Jung et al. .

FOREIGN PATENT DOCUMENTS 74147  6/1980  Japan .................... 228/180.2
72663  4/1985  Japan .................... 228/180.2
57697  3/1989  Japan .................... 228/180.2

OTHER PUBLICATIONS

"Bonded Crossovers for Thin Film Circuits", Burns, J. A., The Institute of Electrical and Electronics Engineers, Inc. pp. 310–313, copyright 1971.

IBM Technical Disclosure Bulletin, "Concept for Forming Multilayer Structures for Electronic Packaging", vol. 30, No. 3, pp. 1353, 1354, Aug. 1987.

Primary Examiner—Samuel M. Heinrich
Attorney, Agent, or Firm—Merchant, Gould, Smith, Edell, Welter & Schmidt

[57] ABSTRACT

A flexible automated bonding apparatus electrically interconnects integrated circuit carriers, printed circuit boards, and other devices. A metallized interconnect pattern is deposited on the surface of the substrate. The metallized interconnects in the pattern span apertures created in the substrate using an excimer laser. Thus, the metallized interconnects can be electrically bonded through the apertures to elements lying underneath the substrate.

26 Claims, 5 Drawing Sheets

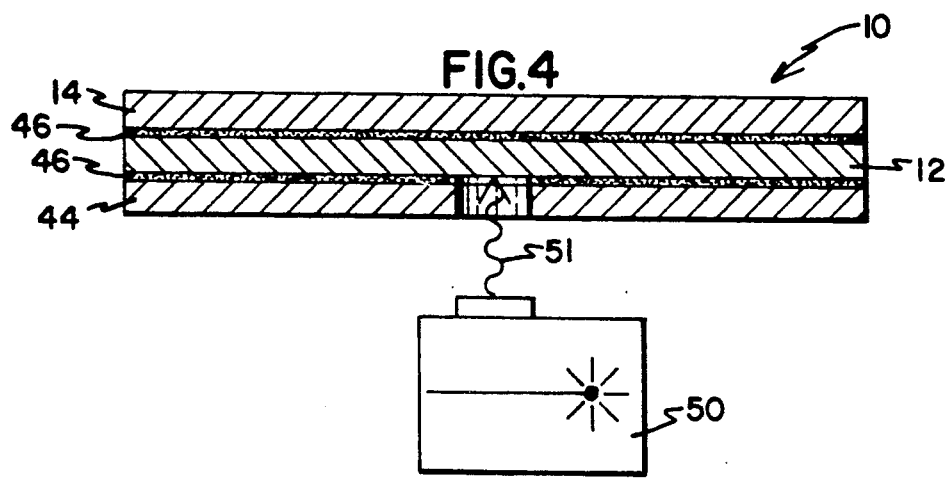
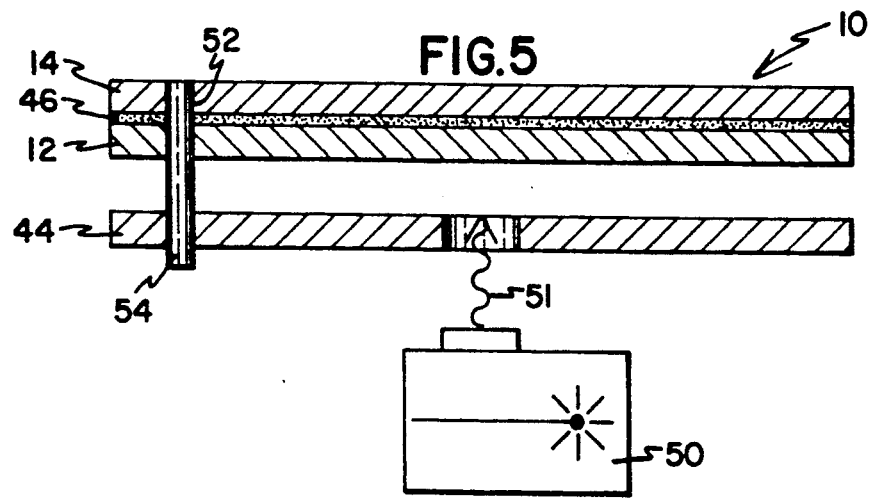

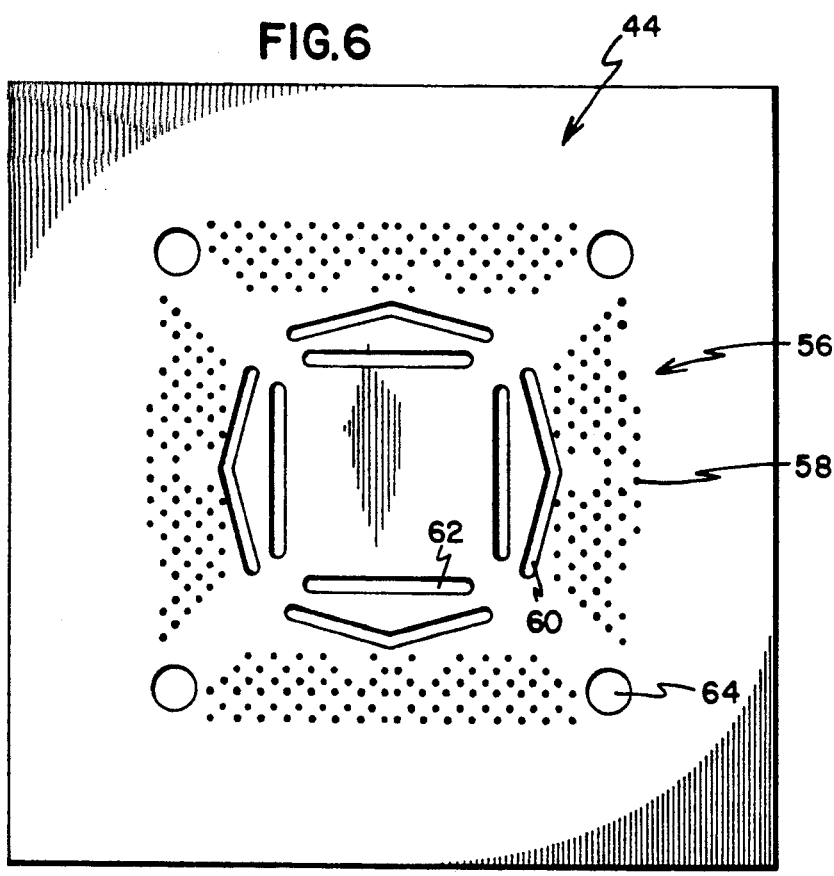
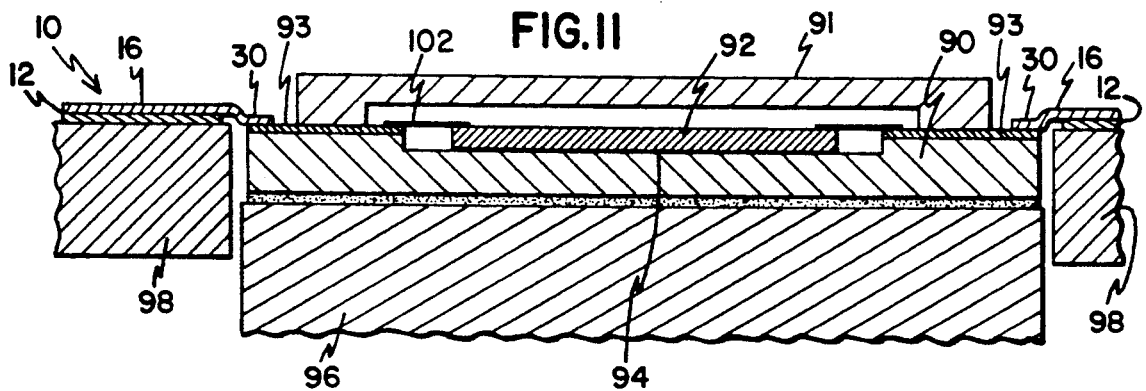
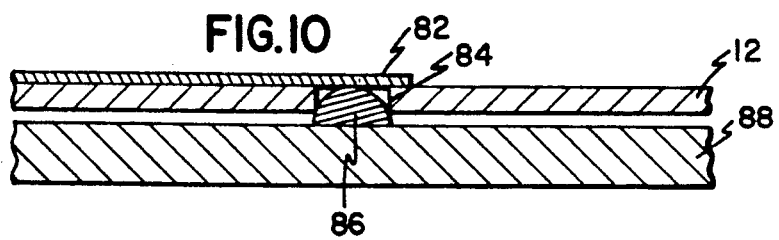

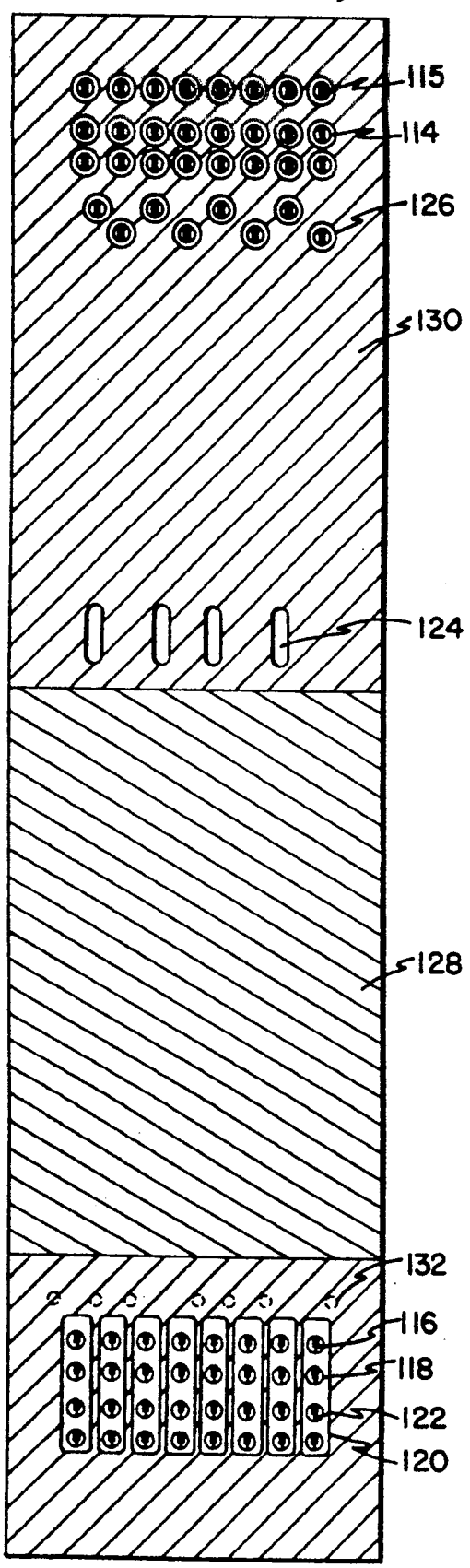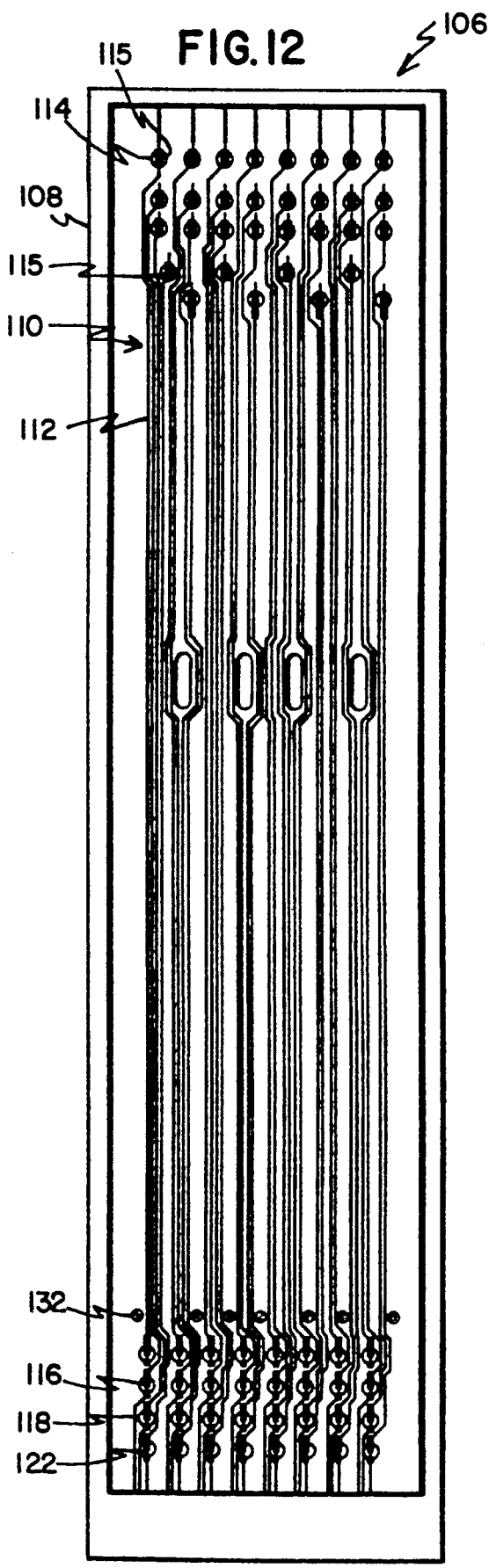

FLEXIBLE AUTOMATED BONDING METHOD AND APPARATUS

FIELD OF THE INVENTION

This invention relates generally to methods for producing Flexible Automated Bonding apparatus that support electrical interconnects for integrated circuit carriers and printed circuit boards. In particular, it is directed to an electrical connection apparatus comprised of metallized interconnects spanning apertures in a Flexible Automated Bonding substrate wherein the apertures are created by various means.

BACKGROUND OF THE INVENTION

Carriers must provide reliable electrical connections between integrated circuits and printed circuit boards. Printed circuit boards must also have reliable electrical connections to other printed circuit boards or devices. A variety of methods for accomplishing these electrical connections are available in the art. One variant comprises a Tape Automated Bonding (TAB) tape with high-density metallized interconnect patterns deposited thereon. The TAB tape provides a carrier that ensures that the metallized interconnect pattern thereon is substantially flat and of consistent geometry. In the bonding process, the TAB tape is generally very short and is bonded adjacent to electrical interconnects on a printed circuit board. The problem with this method is that the metallized interconnect pattern limits the interconnect density and the location of the interconnects since the interconnect density on the chip is much greater than the interconnect density on the circuit board to which it is attached. In addition, such prior art techniques lack sufficient means for aligning the TAB tape to ensure the proper electrical connection.

SUMMARY OF THE INVENTION

To overcome the limitations described above, and to overcome other limitations that will become apparent upon reading and understanding the specification, the present invention provides a method for producing an electrical connection apparatus comprised of a dense metallized interconnect pattern on the surface of a Flexible Automated Bonding substrate. The metallized interconnects may span apertures in the substrate created by an excimer laser, chemical milling or mechanical punching. Thus, the metallized interconnects can be electrically bonded through the substrate to elements lying underneath the substrate.

DESCRIPTION OF THE DRAWINGS

In the drawings, where like numerals refer to like elements throughout the several views.

FIG. 4 is a side view of a laser scanning a substrate with an aperture mask joined to one side thereof;

FIG. 5 is a side view of a laser scanning a substrate with the aperture mask covering one side, wherein the aperture mask is aligned by means of a registration pin;

FIG. 6 is a top view of a surface of a Flexible Automated Bonding substrate covered by a metallized mask defining an aperture pattern;

FIG. 10 is a cross-sectional side view of a metallized interconnect spanning an aperture in a Flexible Automated Bonding substrate, wherein the metallized interconnect is bonded to a conductive bump on a printed circuit board;

FIG. 11 is a cross-sectional side view of a chip carrier electrically interconnected to a printed circuit board; and FIG. 12 shows a top surface of a flexible circuit apparatus comprised of a flexible substrate with a metallized interconnect pattern on the top side with apertures through the substrate; and FIG. 13 shows a bottom surface of the flexible circuit apparatus of FIG. 12 with a ground plane on the bottom surface and apertures through the substrate.

DETAILED DESCRIPTION OF THE PREFERRED EMBODIMENT

In the following detailed description of the preferred embodiments, reference is made to the accompanying drawings which form a part hereof, and in which is shown by way of illustration specific embodiments in which the invention may be practiced. It is to be understood that other embodiments ma be utilized and structural changes may be made without departing from the scope of the present invention.

The present invention consists of an electrical connection apparatus comprised of a metallized interconnect pattern deposited on a Flexible Automated Bonding substrate and a method of fabricating the apparatus. The interconnects may span apertures in the substrate created by an excimer laser and thus may be electrically connected to elements underneath the substrate.

Figure 1:
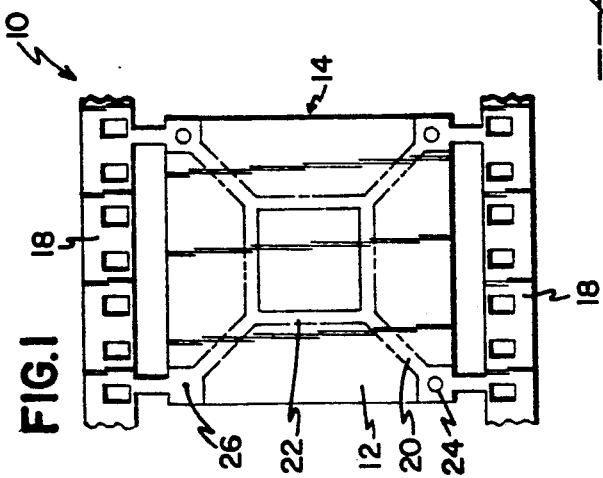
FIG. 1 shows a surface of an integrated circuit carrier bonding apparatus comprised of a Flexible Automated Bonding substrate containing a metallized interconnect pattern.

FIG. 1 shows an electrical connection apparatus 10 for a leadless chip carrier. A leadless chip carrier suitable for connection to the electrical connection apparatus 10 of FIG. 1 is described in co-pending U.S. Pat. application No. 07/506,729 filed Apr. 9, 1990 entitled METHOD OF FABRICATING METALLIZED CHIP CARRIERS FROM WAFER-SHAPED SUBSTRATES to Steitz et al. which is assigned to the same assignee of the present invention and is hereby incorporated by reference. An alternate leadless chip carrier that could be used with the present invention is described in co-pending U.S. Pat. application Ser. No. 07/366,604 filed Jun. 15, 1989 to Neumann et al. entitled CHIP CARRIER WITH TERMINATING RESISTIVE ELEMENTS and assigned to the same assignee of the present invention, which is hereby incorporated by reference.

It may be difficult for printed circuit board pads to achieve a 4 mil pitch, which may be a typical pad pitch for chip carriers. The apparatus 10 provides means for matching the pad pitch of a chip carrier to the pad pitch of a printed circuit board while controlling impedance. Thus, the electrical connection apparatus 10 provides the necessary fan-out to interconnect an integrated circuit with the printed circuit board.

The apparatus 10 is comprised of a metallized interconnect pattern 14 deposited on a Flexible Automated Bonding substrate 12. The substrate 12 is comprised of a dielectric material, preferably an organic film such as Kapton ®, Upilex ®, etc.

Figure 2:
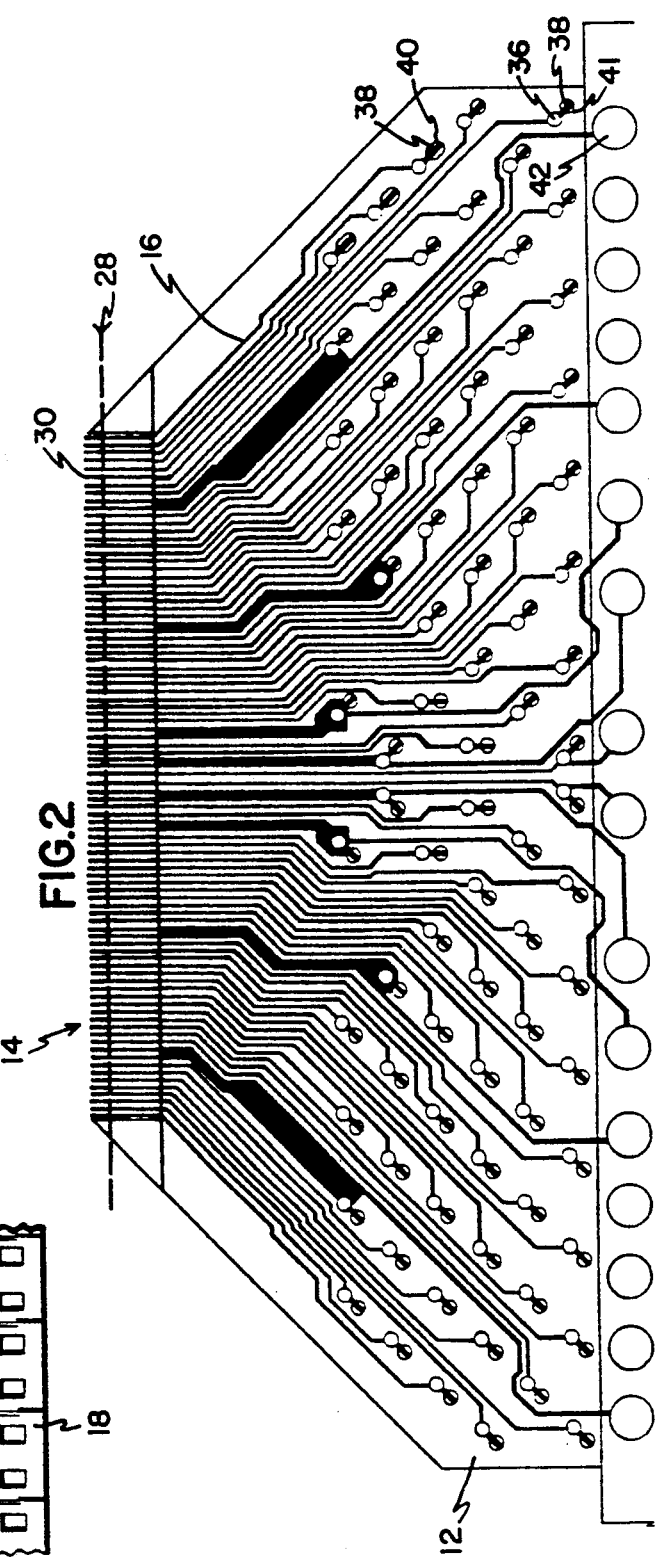
FIG. 2 is an enlargement of the metallized interconnect pattern of FIG. 1.

FIG. 2 is an enlargement of the metallized interconnect pattern 14 of FIG. 1. The pattern 14 is substantially square, measuring 1.2 inches per side. Each side of the pattern 14 contains 90 metallized interconnects 16 (a total of 360 metallized interconnects 16). The pattern 14 is preferably comprised of copper, but those skilled in the art will recognize that other metals could be used.

The metallized interconnect pattern 14 may be created using standard photolithographic techniques. In the preferred embodiment, the metallized interconnect pattern 14 is created using the following method. The substrate 12 is cleaned to prevent contamination. The substrate 12 is coated with a photoresist and covered with a photolithography mask defining the pattern 14. The pattern 14 is developed by exposure to light and the mask is removed. The photoresist is etched from the substrate to expose areas selected by the mask and a metal layer is deposited in the desired pattern 14.

The metallized interconnect pattern 14 also includes metallized bus bars 18, 20, and 22 shown in FIG. 1. These bus bars 18, 20, and 22 supply current in a process that electroplates the metallized interconnects 16 with a gold layer or nickel-gold sandwich to provide a protective passivation layer over the metallized interconnects 16. The gold layer also enhances bonding and eliminates the need for solder between the gold-plated interconnects 16 and gold traces on a leadless chip carrier and/or printed circuit board.

The bus bars 22 also provide structural support to individual metallized interconnects 16 during and after fabrication. The bus bars 18 and 22 are removed prior to bonding to ensure that the individual metallized interconnects 16 are electrically discontinuous. Radial bus bars 20 can be left in place or removed as desired.

Alignment apertures 24 and orientation identifier 26 are also shown in FIG. 1. The orientation identifier 26 resides in the upper left hand corner of the metallized interconnect pattern 14 and alignment apertures 24 occupy the remaining three corners of the pattern 14.

Figure 3:
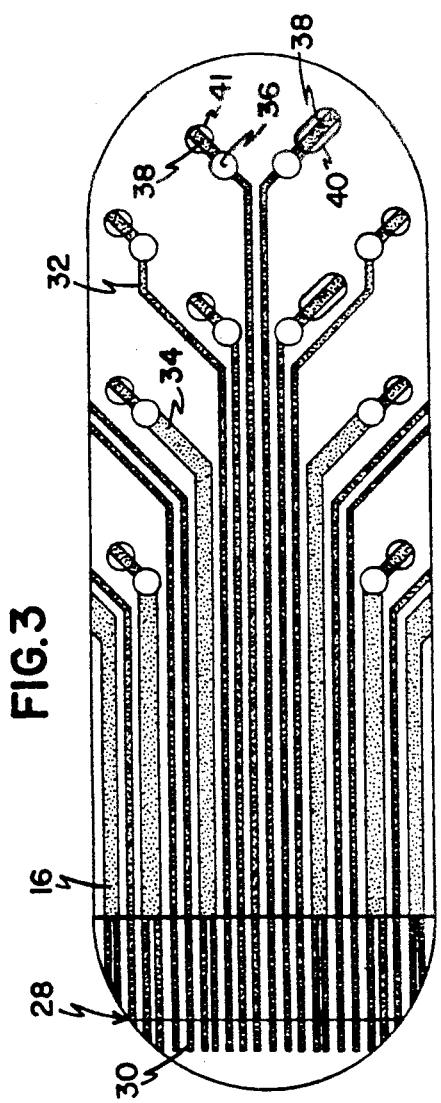
FIG. 3 is an enlargement of the individual interconnects in the pattern of FIG. 2.

FIG. 3 is an enlargement of the individual metallized interconnects 16 of the pattern 14. The metallized interconnect pattern 14 is finely dimensioned and densely packed. The metallized interconnects 16 include cantilevered portions 30 on the inner edge of the pattern 14, which connect to bonding pads on a leadless chip carrier of the type described in co-pending U.S. Pat. application No. 07/506,729 entitled METHOD OF FABRICATING METALLIZED CHIP CARRIERS FROM WAFER-SHAPED SUBSTRATES and incorporated above.

The substrate 12 is removed from the center of the pattern 14 from line 28 inward to create the cantilevered portions 30. The cantilevered portions 30 are 2 mils wide and on 5 mil centers. The width of a metallized interconnect 16 remains consistent from the inner edge of the metallized interconnect pattern 14 to the outer periphery. In the preferred embodiment, two widths are shown for interconnects 16: thin interconnects 32 are 2 mils wide; thick interconnects 34 are 6 mils wide. The spacing between interconnects 16 for both versions is 3 mils. Those skilled in the art will recognize that different widths may be required for different impedances. For example, clock signals and other high fan-out signals may require more current capacity than signals with a single destination.

At the outer periphery of the metallized interconnect pattern 14, the metallized interconnects 16 connect to probe pads 36, cantilevers 38, apertures 40, and optional probe pads 42. These elements are less densely packed than the cantilevers 30 at the inner edge of the pattern 14 to facilitate attachment to printed circuit boards and enhance reworkability. The cantilevers 38 are approximately 6 mils wide and span at least a portion of the apertures 40, 41 at a length of at least 16 mils, as will be more fully described below.

In a preferred embodiment, the probe pads 36 are substantially round with a diameter measuring 20 mils. The probe pads 36 may perform a number of different functions. For example, the probe pads 36 may act as maintenance links, providing a place where the electrical connection between the printed circuit board and the chip carrier can be easily severed. In addition, the probe pads 36 may provide structural strength to the metallized interconnects 16.

Optional probe pads 42 shown in FIG. 2 surround the outer edge of the pattern 14 and connect to some of the metallized interconnects 16. The optional probe pads 42 are substantially circular with a diameter measuring 50 mils. Optional probe pads 42 may be used as contact points for electrical test apparatus. Optional probe pads 42 may also be used for circuit burn-in prior to the final electrical test and assembly to the printed circuit board. Optional probe pads 42 could also be used for electroplating busing contacts.

In a preferred embodiment, the apertures 40 in the substrate 10 are substantially oblong with major and minor diameters measuring 17 and 14 mils. In an alternate preferred embodiment, the apertures could be round such as aperture 41 or any shaped aperture. Those skilled in the art will recognize that other shapes could be used as well. The apertures 40 or 41 are created in the substrate by an excimer laser, chemical milling or mechanical punching, as is described more fully below. Chemical etching, although acceptable, could result in irregularly shaped apertures 40, 41. Alternatively, the metallized interconnects 16 could be plated over pre-existing apertures 40 in a substrate 12. However, such a technique could result in the interconnects 16 sagging into the apertures 40.

To ensure that the interconnects 16 have a smooth and regular surface, the preferred embodiment of the present invention creates the metallized interconnect pattern 14 prior to creating the apertures 40 in the substrate 12. An excimer laser then selectively ablates the substrate 12 to create the apertures 40 or 41.

FIG. 4 shows a cross-sectional side view of an electrical connection apparatus 10. A metallized interconnect pattern 14 is deposited on one side of the substrate 12 as discussed above. A metallized mask 44 defining an aperture pattern covers the opposite side of the substrate 12.

Those skilled in the art will recognize that the metallized mask 44 could be comprised of any one a variety of different metals, including aluminum, copper, stainless steel, molybdenum, etc. Those skilled in the art will also recognize that any one of a variety of methods could be used to join the mask 44 to the substrate 12.

In the preferred embodiment, an aluminum layer is joined to the substrate 12 by lamination 46. A metallized mask 44 is preferably created from the aluminum layer using standard photolithographic techniques. In the preferred embodiment, the following method is used to create the metallized mask 44. The aluminum layer is cleaned and coated to prevent contamination. The aluminum layer is coated with a photoresist and covered with a photolithography mask defining an aperture pattern 56, shown in conjunction with FIG. 6. The photoresist is exposed, the photolithography mask is removed, and the photoresist is developed from the aluminum layer to expose areas selected by the mask. Those skilled in the art will readily recognize that positive or negative photoresist and mask combinations may be used to expose the aperture pattern 56.

FIG. 5 illustrates an alternative embodiment, wherein the metallized mask 44 may be separately milled and mechanically joined to the substrate 12. The mechanical joining permits the mask 44 to be removed with no damage to either the substrate 12 or any metal thereon. The mask 44 is thus reusable. If the mask 44 is mechanically joined to the substrate 12, then it is important that the mask 44 have features for ensuring correct alignment with the substrate 12. FIG. 5 shows the mask 44 aligned over the substrate 12 using registration aperture 52 and pin 54.

Once the metallized mask 44 has been joined to the substrate 12, using the techniques taught in conjunction with either FIGS. 4 or 5, laser light 51 from excimer laser 50 is scanned across the mask 44 vaporizing any exposed substrate 12. In the preferred embodiment, the excimer laser 50 is of a krypton-fluoride composition with a wavelength of 248 nanometers. The substrate 12 is a dielectric which ablates at a lower energy level than the mask 44 or the pattern 14. Thus, the substrate 12 is vaporized, but any metal in or on the substrate 12 remains substantially unharmed. The use of the mask 44 and laser 50 eliminates the need for precise registration control for the laser 50. In this manner, smooth and regular metallized interconnects may span the apertures in the substrate 12.

After the apertures have been created in the substrate 12, the metallized mask 44 may be removed from the substrate 12. If the mask 44 is laminated, sputtered or otherwise deposited on the substrate 12 as shown in FIG. 4, a chemical etch may be required to remove the mask 12 from the substrate 12. When using a chemical etch, it is important that the mask 44 be of a different composition from other metals in the apparatus. For example, in FIG. 4 a pattern 14 made from copper is joined to one side of the substrate 12; on the opposite side of the substrate 12, a metallized mask 44 made from aluminum is joined to the substrate 12. The use of different metals permits the aluminum layer to be removed with a selective chemical etch that does not damage either the substrate 12 or any dissimilar metals in the apparatus, such as the pattern 14.

In an alternative embodiment, the metallized mask 44 may be left joined to the substrate to thereby provide a ground plane or reference plane for the apparatus. The mask 44 would also provide some rigidity to the apparatus.

FIG. 6 shows a top view of the metallized mask 44 covering the substrate 12. Note that any number, size, or shape of apertures 58, 60, 62, and 64, may comprise the aperture pattern 56. The apertures 58 provide for bonding the metallized interconnects 16 to elements underlying the substrate 12. The slots 60 are thermal expansion slots that compensate for differences in the thermal coefficient of expansion at the assembly level to prevent damage to the interconnects 16. The slots 62 aid in the removal of bus bars 22 of FIG. 1 prior to bonding, thus ensuring that the individual metallized interconnects 16 are electrically discontinuous. The slots 62 help create the cantilevered portions 30 of the metallized interconnects 16 required for bonding to the leadless chip carrier. The alignment apertures 64 aid in orienting the apparatus, for example, on a printed circuit board.

Figure 7A:
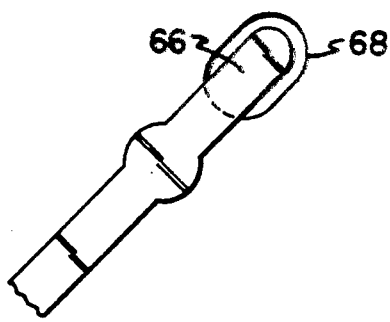
FIG. 7A is a top view and FIG. 7B is a cross-sectional side view of a metallized interconnect cantilevers over an aperture in a Flexible Automated Bonding substrate.
Figure 7C:
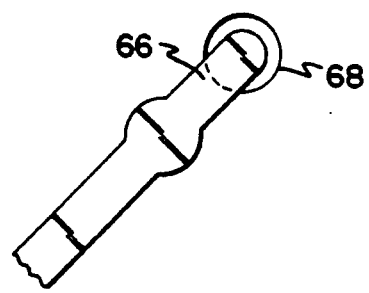
FIG. 7C is a top view of an alternate embodiment of FIG. 7A.
Figure 7B:
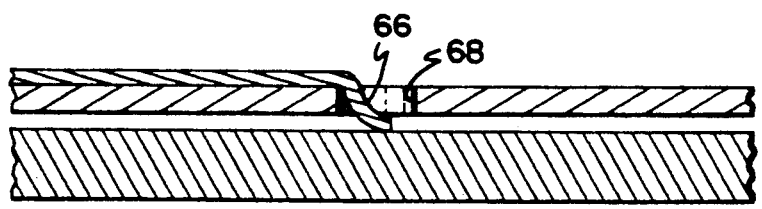

FIG. 7A is a top view and FIG. 7B is a cross-sectional side view of a portion 66 of a metallized interconnect cantilevered over an aperture 68 in the Flexible Automated Bonding substrate. The aperture 68 is preferably oblong with major and minor diameters of 17 and 14 mils. The cantilever 66 is preferably 16 mils in length and 6 mils wide, thus extending to within 1 mil of the far edge of the aperture 68. The downward motion of a bonding tool bends and then bonds the cantilever 66 to an underlying element on a printed circuit board. The cantilever 66 can be bonded to the printed circuit board using any of the standard bonding techniques such as welding, ultrasonic bonding, thermocompression bonding and the like. The aperture 68 may also be round, as shown in FIG. 7C.

Figure 8:
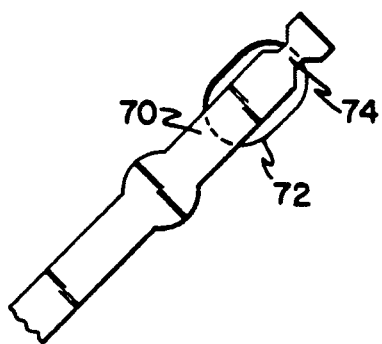
FIG. 8 is a top view of a beam portion of a metallized interconnect spanning an aperture in a Flexible Automated Bonding substrate.

FIG. 8 is a top view of a first alternative embodiment wherein a beam portion 70 of a metallized interconnect spans an aperture 72 in the Flexible Automated Bonding substrate. The beam portion 70 is substantially rectangular measuring 16 mils by 6 mils. The beam 70 narrows from a width of 6 mils to 1.5 mils at a distance of approximately 6 mils from the edge of the aperture 72. This narrow portion 74 of beam 70 is called a "link" and measures approximately 4 mils long. Note that the link 74 widens past the edge of the aperture 72, thereby providing better adhesion to the substrate and ensuring that the link 74 breaks when stress is applied by the downward motion of a bonding tool that breaks the beam 70 at the link 74, bends it through the aperture 72, and then bonds it to a trace or other element lying underneath the substrate, similar to the apparatus shown in FIG. 7B. The beam 70 can be bonded to the trace using any of the standard bonding techniques such as welding, ultrasonic bonding, thermocompression bonding and the like. Thus, the beam 70 makes electrical contact through the aperture 72 with an element lying underneath the substrate.

Figure 9:
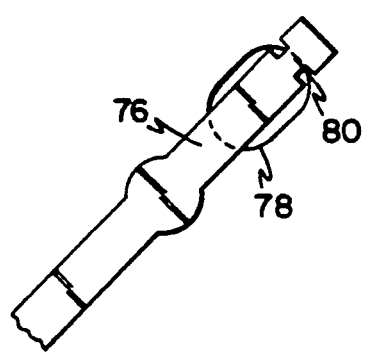
FIG. 9 is a top view of a beam portion of a metallized interconnect spanning an aperture in a Flexible Automated Bonding substrate.

FIG. 9 is a top view of a second alternative embodiment wherein a beam portion 76 of a metallized interconnect spans an aperture 78 in the Flexible Automated Bonding substrate. The beam portion 76 is substantially rectangular measuring 16 mils by 6 mils. The beam 76 squares off at 80 to a width of 2 mils to 1.5 mils at a distance of approximately 2 mils from the edge of the aperture 78. This squared-off portion 80 measures approximately 4 mils long. Note that the squared-off portion 80 widens past the edge of the aperture 78, thereby providing better adhesion to the substrate and ensuring that the squared-off portion breaks when stress is applied by the downward motion of a bonding tool that breaks the beam 76 at the squared-off portion 80, bends it through the aperture 78, and then bonds it to a trace or other element lying underneath the substrate. In both FIG. 8 and FIG. 9, the link is broken by the bonding tool, pushed through aperture 72 and 78, respectively, to form a connection to an element under the substrate.

This breaking of the beam also disconnects the plating bus connection and eliminates an electrical stub.

FIG. 10 is a cross-section of a third alternative embodiment wherein the interconnect 82 is not bent through the aperture 84. Instead, the interconnect 82 is bonded to a conductive bump 86 extending upward through the aperture 84. Aperture 84 of FIG. 10 may correspond to apertures 78, 72 and 78 shown in FIGS. 7A, 8 and 9, respectively. Thus, the interconnect 82 remains substantially planar when bonded to the conductive bump 86. The conductive bump 86 is 6 mils in diameter and 4 mils in height. The substrate 12 is approximately 4 mils thick, or approximately the same as the height of the conductive bump 85. Thus, the interconnect 82 remains substantially planar when bonded to the conductive bump 86.

Standard lithographic techniques may be used to create the conductive bump 86 on the printed circuit board 88. Once an initial metal layer has deposited to create the bump 86, the height of the bump 86 may be further built up by electroplating. In the preferred embodiment, the initial metallization layer consists of copper, and the bump 86 is further built up by electroplating with gold. Gold-to-gold bonding between the interconnect 82 and the bump 86 eliminates the need for solder. Those skilled in the art will readily recognize that other metals or other deposition techniques could be used, including sputtering or electroless plating.

Note that a conductive bump could be used with the alternative embodiments of FIGS. 7A, 7B, 7C, 8 and 9. The cantilever 66, beams 70, and beams 76 of these alternative embodiments, would not be bent through an aperture. One consideration, however, is to minimize the portion of any beam 70 or 76 that may extend beyond the edge of the aperture, as any excess metallization tends to act as an antenna.

The use of the aperture 84 and the conductive bump 86 also assists in the alignment of the apparatus on a printed circuit board 88. Because the bump 86 is visible through the aperture 84 in the substrate 12, the apparatus is especially well suited to automatic alignment using computerized vision systems. Those skilled in the art will readily recognize that a combination of bent-down cantilevers 66 or beams 70, 76 may be used in conjunction with conductive bumps 86 within the present invention.

FIG. 11 shows a side view of a leadless circuit chip carrier 90 using the metallized interconnect apparatus 10 of the preferred embodiment. The leadless chip carrier could be the type described in co-pending and commonly assigned U.S. Pat. application No. 07/506,729 filed Apr. 9, 1990 entitled METHOD OF FABRICATING METALLIZED CHIP CARRIERS FROM WAFER-SHAPED SUBSTRATES, which was incorporated by reference above. An integrated circuit 92 is seated in the carrier 90 and attached thereto by a bond 94. A lid 91 bonded to carrier 90 forms an hermetic seal around integrated circuit 92. The carrier 90 is preferably attached by epoxy to a thermal bump 96 in an aperture of a printed circuit board 98. The thermal bump 96 is preferably in thermal contact with cold plate, for example, as described in the co-pending and commonly assigned Pat. application Ser. No. 07/464,909 entitled "BOARD-MOUNTED THERMAL PATH CONNECTOR AND COLD PLATE" filed Jan. 16, 1990 by David M. Morton, which application is incorporated herein by reference.

In the preferred embodiment, the surface from the carrier 90 to the printed circuit board 98 is substantially planar, so that the Flexible Automated Bonding substrate 12 lies flat. An inner package bonding apparatus 102 electrically connects the integrated circuit 92 to the metallized interconnect 93 of the carrier 90. Cantilevers 30 of metallized interconnects 16 on the substrate 12 electrically connect the metallized interconnect 93 of the carrier 90 to traces on the printed circuit board 98. Alignment of the interconnects 16 may be assisted by aligning the apertures in the substrate 12 with corresponding bumps on the printed circuit board 98. The interconnects 16 may be bonded to bumps or traces on the printed circuit board 98 using any one of a variety of standard bonding techniques, including ultrasonic, thermocompression, welding, etc.

FIGS. 12, and 13 show a double sided, double back bared flex circuit apparatus 106 according to the present invention. FIG. 12 shows a top surface of a flex circuit apparatus 106 comprised of a flexible substrate with a metallized interconnect pattern on the top side with apertures through the substrate. FIG. 13 shows a bottom surface of the flex circuit apparatus 106 of FIG. 12 with a ground plane on the bottom surface and apertures through the substrate. FIGS. 12, and 13 should be viewed together.

The flex circuit apparatus 106 can be used, by way of example but not limitation, to interconnect printed circuit boards to zero insertion force (ZIF) edge connectors or other devices. A ZIF connector suitable for attachment to the flex circuit shown in FIGS. 12 and 13 is described in co-pending U.S. Pat. application No. 07/351,871 filed May 12, 1989 to August et al. entitled TWO PIECE EDGE ZIF CONNECTOR WITH SLIDING BLOCK, which is assigned to the same assignee of the present invention, and which is hereby incorporated by reference. A variation of an edge connector which may be used with the flex circuit of the present invention is described in co-pending U.S. Pat. application No. 07/315,124 filed Feb. 24, 1989 to Neidich entitled CAM ACTUATED ELECTRICAL CONNECTOR which is assigned to the same assignee of the present invention, and which is hereby incorporated by reference.

The flex circuit apparatus 106 is comprised of a Flexible Automated Bonding substrate 108 with a metallized interconnect pattern 110 on the top side (shown in FIG. 12) of the substrate 108 and a ground or reference plane 130 on the bottom side (shown in FIG. 13) of the substrate 108. In an alternate implementation, metallized interconnect patterns could be placed on both sides of the flex circuit with access to the respective interconnect patterns made through apertures in the substrate formed by ablating the substrate using excimer laser, mechanical punching, chemical milling or the like. The flex circuit apparatus 106 is fabricated in a manner similar to the apparatus described above.

The metallized interconnect pattern 110 on the substrate 108 is substantially rectangular, measuring 1.2 inches by 0.325 inches. In the preferred implementation, the pattern 110 contains a total of 32 metallized interconnects 112. In the preferred embodiment, the interconnects 112 are formed by etching the metal layers of a standard diclad laminate using conventional lithographic techniques. In an alternate preferred embodiment, the interconnects 112 may be deposited on the substrate 108 using standard lithographic techniques and electroplating.

The metallized interconnect pattern 110 is finely dimensioned and densely packed. The metallized interconnects 112 shown in FIG. 12 connect to pin beam portions 115 spanning pin apertures 114 to facilitate the electrical connection with connector pins (not shown) placed through the pin apertures 114. The pin beams 115 are shown toward the top of FIG. 12. From the pin beam portions 115 spanning pin apertures 114, the metallized interconnects 112 electrically connect to PC board beam portions 116 spanning apertures 118 in the substrate 108 to facilitate the electrical connection with connections on a PC board placed below pin apertures 118. The PC board beams 116 are shown toward the bottom of FIG. 12.

A PC board beam 116 is substantially rectangular measuring 6 mils wide and spanning the 20 mil diameter aperture 118. As it spans the aperture 118, the beam 116 narrows to a link 122, which is 1.5 mils wide and 4 mils long. Once the link 122 makes contact with the far end of the aperture 118, the link 122 widens for better adhesion to the substrate and ensuring that the link 122 breaks when stress is applied. A bonding tool breaks the beam 116 at the link 122 and then bends the beam 116 through the aperture 118 to weld it or otherwise attach it to a PC board pad. The link 122 may be comprised of a one micron layer of copper, which could be etched to prevent any antenna effect. The beam 116 may also make electrical contact with a bump or trace residing on a printed circuit board or other device as described above. In a similar fashion, beams 115 are bent by a bonding tool and welded or otherwise attached to connector sockets on an electrical connector.

FIG. 13 shows the bottom side of the flex circuit 106. In the preferred implementation, the flex circuit of FIGS. 12 and 13 is constructed by first using a standard diclad material in which copper layers are bonded to the top and bottom of a flexible substrate. The patterns shown in FIG. 12 are then produced by standard photolithography techniques. The apertures etched into the bottom side of substrate 106 shown in FIG. 13 are also produced by standard photolithographic techniques. The remaining copper on the bottom side of the flex circuit 106 is used as a ground or reference plane. Clearance holes 126 and 120 are etched into the copper 130 of the bottom side of the substrate shown in FIG. 13 to provide clearance for the electrical connection to the beams 115 and 116 on the top side of the circuit. Clearance holes 126 and 120 are etched into the copper before apertures 114 and 118 are formed through the substrate.

Apertures 124 are etched through the copper layer 130 on the bottom of the flex circuit 106 shown in FIG. 13 and the substrate is removed from the same area to provide apertures all the way through the flex circuit. These apertures are used to allow a bonding material such as epoxy to be placed through apertures 124 to provide a rigid connection to, for example, a connector body. Apertures 132 shown formed through the substrate from the top side of the flex circuit 106 shown in FIG. 12 and shown as dashed portions on the bottom side of flex circuit 106 shown in FIG. 13. These apertures 132 are used to attach the bottom copper material 130 to the circuit board to provide electrical connection to the ground plane or voltage reference plane on the circuit board.

A portion of the flex circuit 128 is also etched away from the copper material 130 on the bottom side of flex circuit 106 shown in FIG. 13 using standard photolithographic techniques. The copper portion 128 etched away is then redeposited using vapor deposition or sputtering to provide a much thinner layer of copper in area 128. This is in the area of the flexible circuit which encounters the maximum amount of flexing. By providing a very thin layer of copper at position 128, the flex ductility of the circuit at that point is increased with less risk of damaging or delaminating the copper material.

Two metallized masks (not shown) are used to burn the apertures in the substrate 108 using an excimer laser, as described above. Each mask covers one of the two surfaces of the substrate 108. The mask for the "top" or pattern surface of the substrate 108 defines an aperture pattern comprising stress relief apertures 132. Each of the apertures 132 identify where the substrate 108 is to be vaporized as the laser scans across the "top" surface of the substrate 108. The mask for the "top" is preferably created separately so that it is reusable. Otherwise, the same techniques described above is used to create the mask.

Before the substrate can be ablated from the bottom of substrate 108, apertures must be etched in the copper ground or reference plane to expose the substrate. Clearance holes 126 are 30 mils in diameter and are etched into the bottom copper reference plane. Clearance holes 126, 124 and 120 are etched using standard lithographic etching technique to provide copper-free zones around apertures 114, 124 and 118.

The substrate aperture mask for the "bottom" surface of the substrate 108 shown in FIG. 13 defines an aperture pattern comprising apertures 114, 124, and 118. Each of the apertures 114, 124, and 118 identify where the substrate 108 is to be vaporized as the laser scans across the "bottom" surface of the substrate 108. The mask for the bottom side may be attached or placed as described above in conjunction with FIGS. 4 and 5.

In an alternate preferred method, the mask for the "bottom" is a ½ oz. rolled/annealed copper layer. Those skilled in the art will recognize that the mask could be sputtered, vapor deposited, or otherwise joined to the substrate 108. The mask is preferably not removed after the apertures 114, 124, and 118 have been created using an excimer laser, but instead remains joined to the flex circuit apparatus 106 to act as the ground or reference plane. Copper-free clearance zones 126, 124 and 120 can then be created in the mask surrounding apertures 114, 124 and 118 using standard lithographic techniques.

The ground plane 130 may be too rigid to "flex" properly. Thus, after the apertures 114, 124, and 118 have been created using the excimer laser, the area 128 may be etched from the ground plane. A very thin copper layer is sputtered to cover area 128 to make the ground plane electrically continuous again. The thin copper layer sputtered into area 128 ensures both flexibility and electrical continuity.

FIG. 5 illustrates an alternative masking technique which can be used in conjunction with the circuits of FIGS. 12 and 13, wherein the metallized mask 44 may be separately milled and mechanically joined to the substrate 12 (corresponding to substrate 108 of FIGS. 12 and 13). The mechanical joining permits the mask 44 to be removed with no damage to either the substrate 12 or any metal thereon. The mask 44 is thus reusable. If the mask 44 is mechanically joined to the substrate 12, then it is important that the mask 44 have features for ensuring correct alignment with the substrate 12. FIG. 5 shows the mask 44 aligned over the substrate 12 using registration aperture 52 and pin 54.

Thus, the preferred embodiment discloses an electrical connection apparatus comprised of a metallized interconnect pattern deposited on a Flexible Automated Bonding substrate and a method of fabricating the apparatus. The interconnects may span apertures in the substrate created by an excimer laser and thus may be electrically connected to elements underneath the substrate.

In an alternate preferred embodiment, the flex circuit of FIG. 12 is implemented without the ground plane copper surface 128 shown in FIG. 13. Thus, the underside of the flex circuit of FIG. 12 is manufactured such that the substrate 108 is exposed. The apertures 120, 124 and 126 are formed as described above. In addition, the top surface of FIG. 12 is partially covered by an insulating material such as Kapton ®, Upilex ® or other organic film over portion 134 of FIG. 12. The addition of this insulating material is to further protect the metallized traces 110 through the portion of maximum flexing to get the metal into the neutral axis. This covering 134 may be of transparent material and will protect the traces from separating from the substrate or otherwise being damaged by the flexing of flex circuit 106.

Although specific embodiments have been illustrated and described herein, it will be appreciated by those of ordinary skill in the art that any arrangement which is calculated to achieve the same purpose may be substituted for the specific embodiments shown. For example, the present invention disclosed herein may be implemented with different substrates. In addition, different processing steps or metallized patterns than those disclosed in the detailed description could be used. This application is also intended to cover any adaptations or variations of the present invention. One such variation would be to use the Flexible Automated Bonding substrate of the present invention to electrically connect components other than those described herein. Thus, it is manifestly intended that this invention be limited only by the claims and the equivalents thereof.

We claim:

1. A Flexible Automated Bonding apparatus for electrical interconnection to a device, comprising:
   (a) a non-conducting, flexible substrate having first and second surfaces;
   (b) at least one metallized interconnect pattern on the first surface of said substrate having at lest one conductive path, said conductive path having a bottom surface in contact with the first surface of said substrate;
   (c) at least one aperture through the first and second surfaces of said substrate exposing a portion of said conductive path spanning at least a portion of each aperture for electrical interconnection of the exposed conductive path portion through said aperture to the device; and
   (d) bonding means for electrically connecting said metallized interconnect pattern through said aperture to a conductive element on the device when the second surface of the substrate is in contact with the device, said bonding means comprising said exposed conductive path portions which span at least a portion of said apertures.

2. The apparatus of claim 1, wherein said bonding means further comprises:
   (1) means for bending said exposed conductive path portion through said aperture towards the conductive element; and
   (2) means for bonding said exposed conductive path portion to said conductive element.

3. The apparatus of claim 2, wherein said exposed conductive path spans the aperture and is configured to break at a particular point over said aperture.

4. The apparatus of claim 1, wherein said bonding means further comprises:
   (1) means for aligning said aperture with a conductive protrusion on said conductive element of the device positioned under said aperture, said apertures being adapted to receive at least a portion of said protrusions;
   (2) means for bonding and electrically connecting said exposed conductive path to said conductive protrusion through said aperture.

5. The apparatus of claim 1, wherein said substrate is an organic film.

6. The apparatus of claim 1, wherein said metallized interconnect pattern is comprised of metallized interconnects deposited by thin-film techniques.

7. The apparatus of claim 1, further comprising at least one thermal expansion aperture through said substrate to compensate for differences in the thermal coefficient of expansion at an assembly level thereby preventing damage to the metallized interconnects.

8. The apparatus of claim 1, further comprising means for electrically probing said metallized interconnect pattern.

9. The apparatus of claim 1, further comprising means for providing gold-to-gold bonding between the devices being electrically interconnected and the apparatus.

10. A method of fabricating a Flexible Automated Bonding apparatus, comprising:
    (a) fabricating a metallized lead pattern on a first surface of a flexible, non-conducting substrate, said lead pattern comprised of at least one conductive path;
    (b) covering a second surface of said substrate with a metallized mask defining an aperture pattern, said aperture pattern identifying at least one aperture through said substrate underneath said conductive path; and
    (c) scanning said mask with laser light having an emission wavelength that does not damage said lead pattern and said mask, and further, so that said laser light ablates any areas of said substrate exposed by said aperture pattern.

11. The method of claim 10, further comprising selectively removing said mask from said substrate.

12. The method according to claim 11, further comprising the step of washing said substrate with a chemical etch that selectively removes only said mask.

13. The method according to claim 12, wherein said metallized lead pattern comprises a first metal and said metallized mask comprises a second metal.

14. The method according to claim 10, wherein step (a) further comprises depositing said lead patter using thin-film techniques.

15. The method according to claim 10, wherein step (a) further comprises etching said lead pattern from an adhered metal layer.

16. The method of claim 10, wherein step (a) further comprises:
    (1) placing a first metal layer on said substrate;
    (2) coating said first metal layer with a photoresist;
    (3) covering said first metal layer with a mask, thereby identifying an aperture pattern on said first metal layer;

(4) developing said photoresist on said first metal layer;

(5) etching said first metal layer where said selected area was exposed, such that said aperture pattern is defined on said substrate; and (6) stripping said photoresist from said first metal layer to expose an area selected by said mask.

17. The method according to claim 10, wherein step (b) further comprises depositing said metallized mask using thin-film techniques.

18. The method according to claim 10, wherein step (b) further comprises etching said metallized mask from an adhered metal layer to define said aperture pattern.

19. The method according to claim 10, wherein said metallized mask performs as a ground plane or a voltage reference plane.

20. The method of claim 10, further comprising sputtering a metal into said aperture pattern to maintain electrical continuity.

21. The method of claim 10, wherein step (b) comprises laminating said metallized mask onto said substrate.

22. A method for attaching integrated circuit carriers to printed circuit boards using a flexible automated bonding substrate having first and second surfaces with metallized interconnects on the first surface and apertures formed through the first and second surfaces of the substrate to expose a bottom surface of a portion of the metallized interconnects, the method comprising:

(a) attaching the carrier to the printed circuit board;

(b) placing the second surface of the substrate in contact with the printed circuit board;

(c) aligning apertures in the flexible automated bonding substrate and associated exposed portions of the metallized interconnects with corresponding elements on the printed circuit board; and (d) bonding the exposed portions of the metallized interconnects to the corresponding elements on the printed circuit board.

23. The method of claim 22 wherein the attaching step (a) further comprises attaching the carrier to a thermal connector in an aperture of the printed circuit board, said thermal connector being in thermal contact with a cold plate.

24. The method of claim 22 wherein the corresponding elements comprise conductive bumps on the printed circuit board extending upward into said apertures in the flexible automated bonding substrates.

25. The method of claim 22 further comprising bending the exposed portions of the metallized interconnects through said apertures in the flexible automated bonding substrate and bonding the metallized interconnects to the corresponding elements on the printed circuit board.

26. A method of aligning a Flexible Automated Bonding apparatus on a printed circuit board, comprising:

(a) grossly aligning the Flexible Automated Bonding apparatus by matching at least one alignment aperture in a substrate with an alignment bump or alignment pin hole on a bonding surface or an alignment pin; and (b) finely aligning the Flexible Automated Bonding apparatus by matching at least one metallized interconnect aperture in said substrate with a bonding pad on said printed circuit board, thereby providing electrical connection between said metallized interconnect and said bonding pad.

* * * * *

UNITED STATES PATENT AND TRADEMARK OFFICE
CERTIFICATE OF CORRECTION

PATENT NO. : 5,127,570

DATED : July 7, 1992

INVENTOR(S) : Steitz et al.

It is certified that error appears in the above-identified patent and that said Letters Patent is hereby corrected as shown below:

Abstract, line 2, "flexible automated bonding" should read --Flexible Automated Bonding--.

Column 2, line 5, "cantilevers" should read --cantilevered--.

Column 2, line 39, "ma" should read --may--.

Column 2, lines 53 and 60, "application" should read --Application--.

Column 2, line 61, "Jun." should read --June--.

Column 4, line 64, insert --of-- after the word "one".

Column 5, line 48, "12"(1st occurrence) should read --44--.

Column 7, lines 52 and 64, "application" should read --Application--.

Column 8, lines 32 and 40, "application" should read --Application--.

Column 11, line 45, "lest" should read --least--.

UNITED STATES PATENT AND TRADEMARK OFFICE
CERTIFICATE OF CORRECTION

PATENT NO. : 5,127,570
DATED : July 7, 1992
INVENTOR(S) : Steitz et al

It is certified that error appears in the above-indentified patent and that said Letters Patent is hereby corrected as shown below:

Column 12, line 57, "patter" should read --pattern--.

Column 14, line 14, "substrates" should read --substrate--.

Signed and Sealed this

Twenty-fourth Day of August, 1993

Attest:

BRUCE LEHMAN

Attesting Officer

Commissioner of Patents and Trademarks